United States Patent [19]

Schmidgall

[11] 3,801,866

[45] Apr. 2, 1974

[54] FLASHING NOVELTY DEVICE

[76] Inventor: Phillip L. Schmidgall, 1820 E. 75th St., Indianapolis, Ind. 46240

[22] Filed: Dec. 11, 1972

[21] Appl. No.: 313,926

[52] U.S. Cl........... 315/200 A, 331/108 D, 331/111

[51] Int. Cl........................................... H05b 33/00

[58] Field of Search............ 331/108 C, 108 D, 111; 315/200 A

[56] References Cited

UNITED STATES PATENTS 3,659,224 4/1972 Ball................................ 331/108 C

*Primary Examiner*—John Kominski

*Attorney, Agent, or Firm*—Hood & Coffey

[57] ABSTRACT

A two-function oscillator comprising an integrated circuit device and a plurality of circuit components externally connected to the device. The circuit device provides an output terminal and a voltage-level responsive circuit therewithin for changing the state of the voltage on the output terminal from a level approximately equal to the applied voltage to a second level approximately equal to ground level. A first load circuit is placed between the said output terminal and ground to be energized when the voltage on the output terminal is approximately equal to the applied voltage and a second load circuit is connected between the output terminal and the terminal to which the voltage is applied to be energized when the said output terminal is approximately at ground level. An externally connected capacitor is discharged through the integrated circuit device as it changes state, and it is the voltage-level on the capacitor which causes the voltage on the said output terminal to switch from the applied voltage level to ground level.

4 Claims, 3 Drawing Figures

FLASHING NOVELTY DEVICE

The present invention relates to oscillators, and more particularly to the provision of an oscillator ideally suited for use in flashing novelty devices. It will be appreciated, however, that my oscillator circuitry may have many other uses.

My invention is a two-function oscillator comprising an integrated circuit device providing a voltage input terminal, an output terminal, a ground terminal, a discharge terminal, a first output stage transistor connected between the input terminal and the output terminal, a second output stage transistor connected between the output terminal and ground, voltage-level responsive circuit means for alternately rendering the output stage transistors conductive such that, when the said first transistor is conductive, the voltage on the output terminal is approximately equal to the voltage applied to the input terminal and, when the second transistor is conductive, the voltage on the output terminal is approximately at ground level, and a discharge transistor connected between the discharge terminal and ground, the discharge transistor being connected to and dominated by the said circuit means to be rendered conductive when the second output stage transistor is rendered conductive.

The output terminal, therefore, swings between two voltage states, its voltage level approximately equal to the applied voltage level and its level approximately equal to ground level. In accordance with my invention, I connect a plurality of circuit components to the said integrated circuit device, the components including first load circuit components connected between the said output terminal and ground to be energized when the first output stage transistor is conductive to provide the applied voltage at the output terminal and second load circuit components connected between the input terminal and the output terminal to be energized when the second transistor is conductive to place the output terminal at ground level. As an external component, I connect a timing capacitor between the said voltage-level responsive circuit means and ground such that the switching of the circuit means between its alternate states is determined by the voltage on the capacitor. Then, I connect resistance means between the said input terminal and the capacitor to determine the charging time constant for the capacitor and resistance means between the capacitor and the said discharge terminal to determine the discharging time constant of the capacitor.

In one preferred embodiment of my invention, the load circuit components are light emitting diodes and resistors as will be discussed hereinafter. The light emitting diodes will alternately flash on and off at a frequency determined by the charging and discharging rate of the capacitor. All sorts of novelty devices, such as tie clasps, lapel pins, and the like, can be made to incorporate the alternately flashing diodes.

Other objects and features of my present invention will become apparent as this description progresses.

To the accomplishment of the above and related objects, this invention may be embodied in the forms illustrated in the accompanying drawings, attention being called to the fact, however, that the drawings are illustrative only, and that change may be made in the specific constructions illustrated and described, so long as the scope of the appended claims is not violated.

Figure 2:
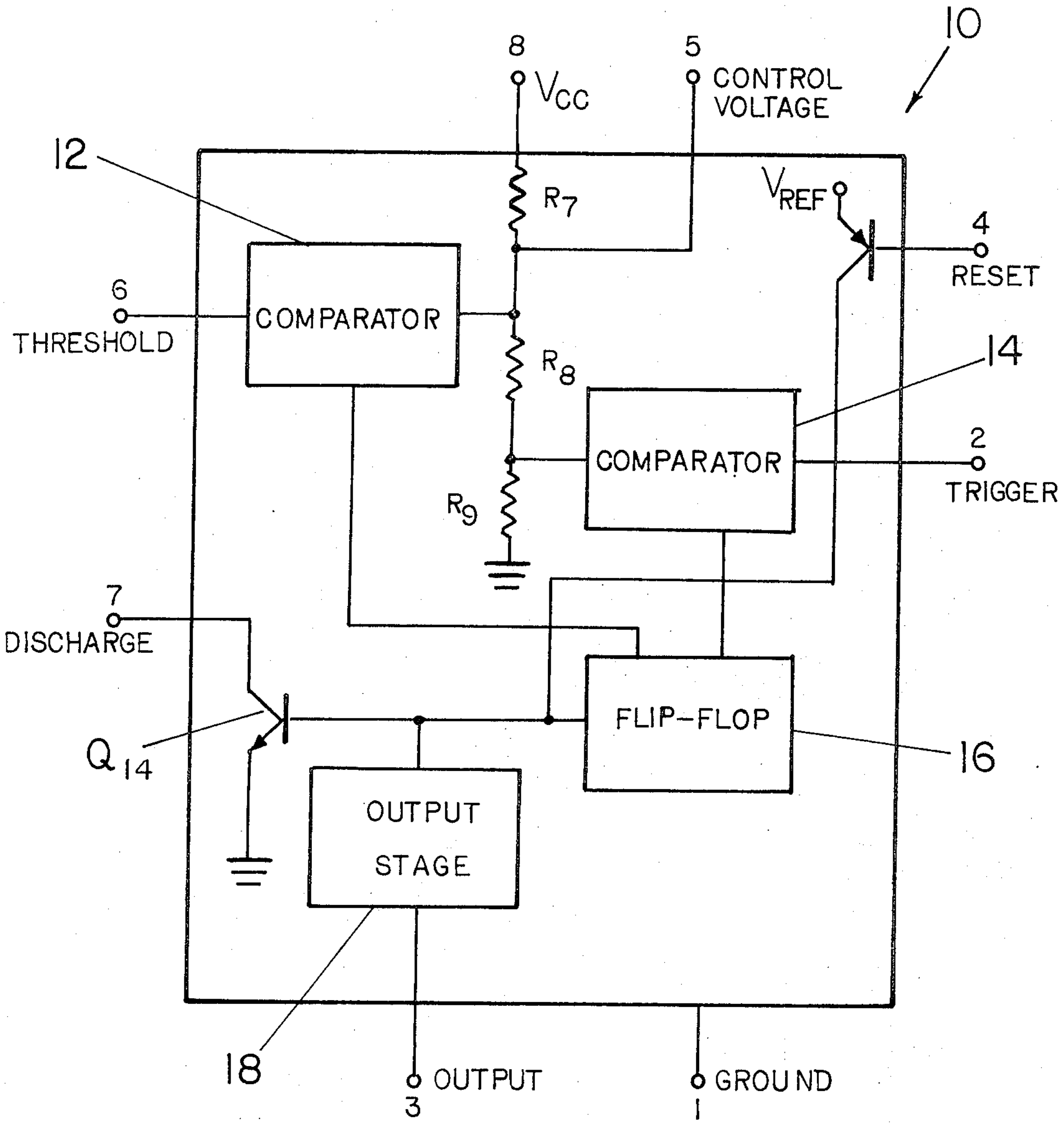
FIG. 2 is a block diagram of the basic integrated circuit device of FIG. 1.

Turning now to the drawings, the integrated circuit device itself is indicated generally by the reference numeral 10. As shown in FIG. 2, the device 10 includes a comparator 12, comparator 14, flip-flop 16, and output stage 18. The device 10 is a conventional and commercially available device commonly called a linear integrated circuit. Signetics, a subsidiary of Corning Glass Works at 811 East Arques Avenue, Sunnyvale, California 94086 sells such devices and refers to them as NE/SE 555 timing circuits.

Figure 3:
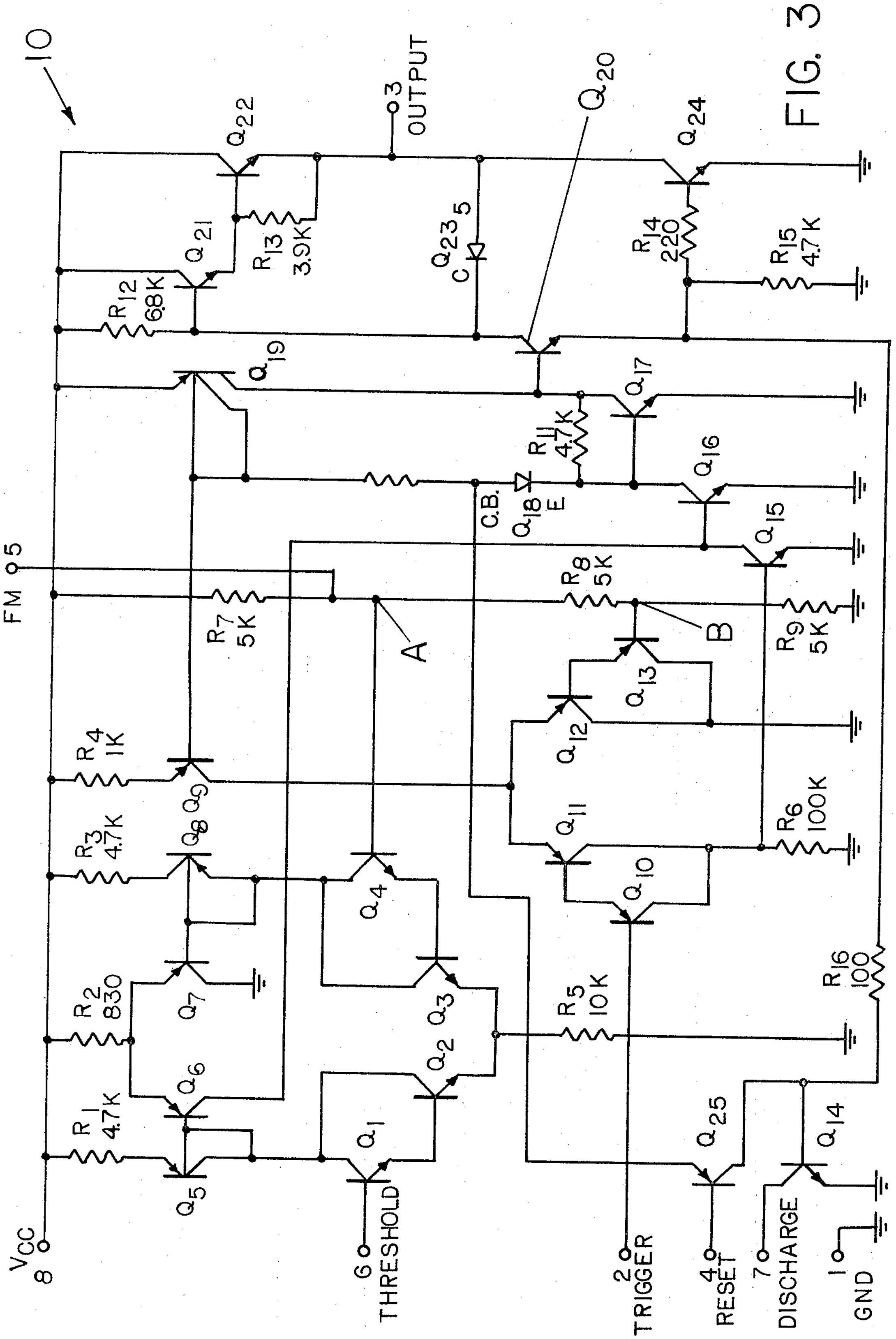
FIG. 3 is a schematic diagram of the equivalent circuit of the integrated circuit device.

Comparing the block diagram of FIG. 2 to the equivalent circuit diagram of FIG. 3, the comparator 12 comprises basically transistors $Q_1$, $Q_2$, $Q_3$, and $Q_4$, with the base of transistor $Q_4$ being connected to a voltage divider comprising resistors $R_7$, $R_8$, $R_9$. As shown in FIG. 3, each of the resistors $R_7$, $R_8$, $R_9$ are 5,000 ohm resistors such that two-thirds of the voltage applied to pin 8 is the reference voltage for the comparator 12. When the voltage on the pin 6 (base of transistor $Q_1$) is equal to or higher than the voltage on the base of transistor $Q_4$, the comparator 12 is rendered conductive. I refer to the point A on the voltage divider as the first reference point defining the first reference voltage.

The comparator 14 comprises the transistors $Q_{10}$, $Q_{11}$, $Q_{12}$, $Q_{13}$, with the base of transistor $Q_{13}$ being connected to the above-described voltage divider at point B so that it sees one-third the voltage applied to pin 8. When the voltage on pin 2 is equal to or lower than one-third the voltage applied to the pin 8, the comparator 14 is rendered conductive. I refer to the point B on the divider as the second reference point defining the second and lower reference voltage.

The output stage 18 includes first and second output stage transistors $Q_{22}$, $Q_{24}$.

The flip-flop 16 comprises the transistors $Q_{15}$, $Q_{16}$, $Q_{17}$, $Q_{20}$. The flip-flop 16 determines which of the two output stage transistors $Q_{22}$ or $Q_{24}$ is conductive. Due to the well-known characteristics of a flip-flop circuit, the output transistors $Q_{22}$, $Q_{24}$ will alternate, transistor $Q_{22}$ being conductive when the flip-flop 16 is in the first of its two states while pin 6 voltage is below two-thirds of the applied voltage and transistor $Q_{24}$ being conductive when the flip-flop is in the second of its two states after pin 6 voltage has reached two-thirds of the applied voltage. The output stage 18 includes the two transistors $Q_{22}$, $Q_{24}$. Pins 2 and 6 are externally connected together as seen in FIG. 1.

The other component of the block diagram of FIG. 2, i.e., the integrated circuit device 10, is the transistor $Q_{14}$ which discharges timing capacitor 36 through resistors 32 and 34.

CIRCUIT OPERATION

Figure 1:
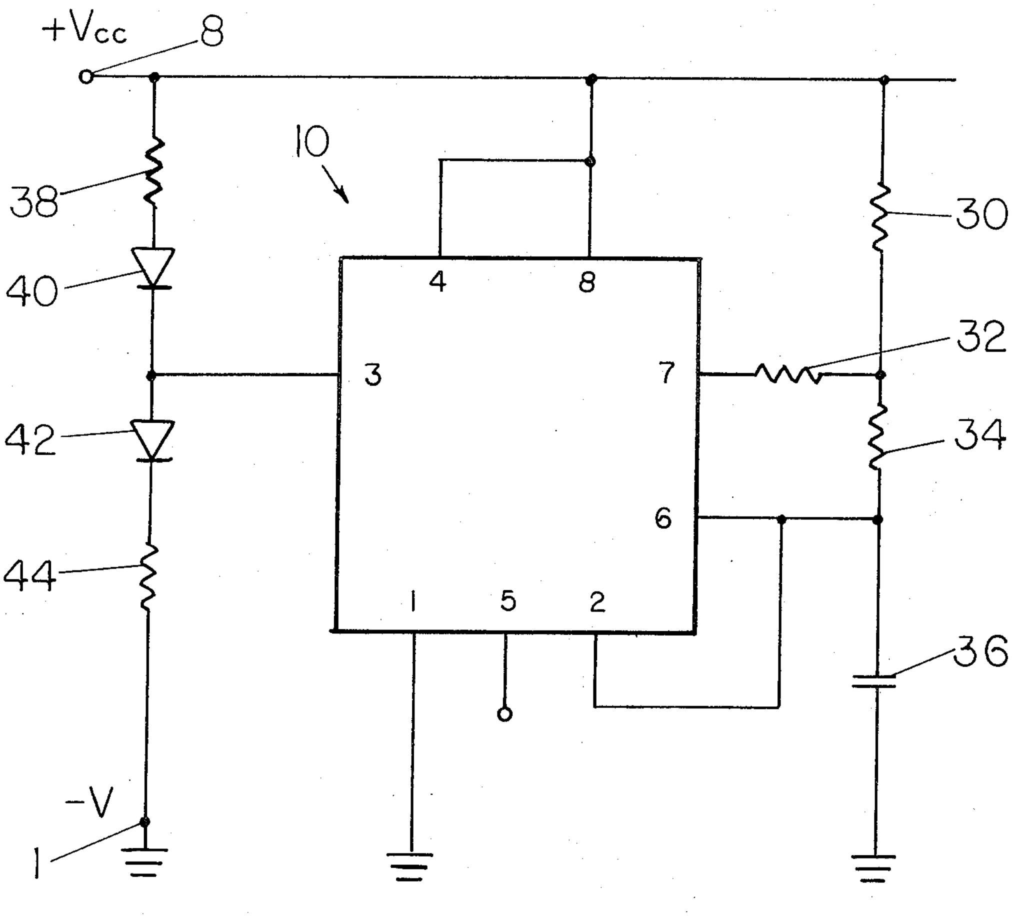
FIG. 1 is a schematic drawing showing the manner in which I connect circuit components to a basic integrated circuit device.

When voltage is first applied between pins 1 and 8, capacitor 36 starts charging through resistors 30 and 34 which I have connected between pin 8 and the capacitor as illustrated in FIG. 1. During the time it takes to charge capacitor 36 to two-thirds of the applied voltage, flip-flop 16 is in its first state and transistor $Q_{22}$ is conductive which causes the output pin 3 to be nearly equal to the applied positive voltage on pin 8 and allows current to flow through a light emitting diode 42 and resistor 44 which I have connected between the output pin 3 and ground.

As the voltage on capacitor 36, which is connected to pins 2 and 6, reaches two-thirds the applied voltage, comparator 12 is rendered conductive which causes flip-flop 16 to change to its second state. When flip-flop 16 is in its second state, transistors $Q_{14}$ and $Q_{24}$ are rendered conductive and transistor $Q_{22}$ is rendered non-conductive. When transistor $Q_{24}$ is conducting, the output pin 3 is nearly at ground potential which allows current to flow through a resistor 38 and light emitting diode 40 which I have connected between pins 3 and 8 as illustrated in FIG. 1. Also, when transistor $Q_{14}$ is conducting, capacitor 36 is discharging through resistors 32, 34 (FIG. 1). When the voltage on capacitor 36 reaches one-third of the applied voltage, comparator 14 is rendered conductive which changes flip-flop 16 back to its first state which starts the cycle over again to proceed as explained above, i.e., to start charging capacitor 36.

By placing resistor 32 in the circuit as shown in FIG. 1, i.e., in the pin 7 discharge path for the capacitor 36, and by choosing the value of resistor 32, I have made the time for discharging $T_d$ of the capacitor 36 equal to the charging time $T_c$ of the capacitor. The circuit of FIG. 1 is a free-running oscillator. Since the charging time $T_c$ of capacitor 36 is equal to the discharging time $T_d$ of the capacitor, and since it is the charging and discharging of the capacitor which causes the circuit to oscillate between its two states, the light emitting diodes 40, 42 will alternate on and off and will remain on for equal periods of time.

By inserting resistors 38, 44 in the light emitting diode circuitry of FIG. 1, light emitting diode 40 cannot conduct when transistor $Q_{22}$ is conducting, and, likewise, light emitting diode 42 cannot conduct when transistor $Q_{24}$ is conducting. Thus, the integrated circuit 10, which is intended to be a delay-on or delay-off, one function circuit is made to act as a two-function flip-flop although only one output pin (pin 3) is changing state whereas a true flip-flop circuit has two output pins which change state alternately, Illustratively, resistors 30, 32, 34 may, respectively, be 2,200 ohms, 3,300 ohms, and 47,000 ohms. Capacitor 36 may be a 12 microfarad, 6 volt capacitor. Resistors 38, 44 may each be 680 ohm resistors.

The values of the resistors of the equivalent circuit shown in FIG. 3 are placed upon the drawing itself for ready reference.

The comparators 12, 14 and flip-flop 16, therefore, comprise a voltage-level responsive circuit means for alternately rendering the output stage transistors $Q_{22}$, $Q_{24}$ conductive, i.e., a circuit means that switches between its alternate states because of change in voltage level on the capacitor 36. The resistors 38, 44 and diodes 40, 42 are the load circuit components of my oscillator.

I claim:

1. An oscillator comprising an integrated circuit device providing a voltage input terminal, an output terminal, a ground terminal, a timing capacitor discharge terminal, a pair of voltage sensing terminals, a voltage divider circuit between said input terminal and ground terminal, said divider providing a first reference point defining a first reference voltage and a second reference point defining a second and lower reference voltage, a flip-flop circuit having first and second alternate states, a first comparator for connecting said flip-flop to said first reference point, a second comparator for connecting said flip-flop to said second reference point, each of said comparators including a connection to one of said voltage sensing terminals, and circuit means which becomes conductive when the voltage on its sensing terminal corresponds to the voltage on the said reference point to which said comparator is connected, a first output stage transistor connected between said input terminal and said output terminal, a second output stage transistor connected between said output terminal and ground, said output stage transistors being connected to and dominated by said flip-flop such that, when said flip-flop is in its first state, said first transistor is rendered conductive to provide the applied voltage on said output terminal and, when said flip-flop is in its second state, said second transistor is rendered conductive to lower the voltage on said output terminal to ground level, and a discharging transistor connected between said discharge terminal and ground, said discharging transistor being connected to said flip-flop to be rendered conductive when said flip-flop is in its second state, and a plurality of circuit components connected to said integrated circuit device, said components including first load circuit components connected between said output terminal and ground to be energized when said flip-flop is in its first state, second load circuit components connected between said input terminal and said output terminal to be energized when said flip-flop is in its second state, a capacitor connected between said voltage sensing terminals and ground such that the voltage on said capacitor is present on said sensing terminals, resistance means connected between said input terminal and said capacitor, and resistance means connected between said capacitor and said discharge terminal.

2. The invention of claim 1 in which said first and second load circuit components each include a light-emitting diode and resistor, each said resistor being effective to prevent the light-emitting diode of the opposite load circuit from conducting when its associated light-emitting diode is conducting.

3. A two-function oscillator comprising an integrated circuit device providing a voltage input terminal, an output terminal, a ground terminal, a discharge terminal, a first output stage transistor connected between said input terminal and said output terminal, a second output stage transistor connected between said output terminal and ground, voltage-level responsive circuit means for alternately rendering said output stage transistors conductive such that, when said first transistor is conductive, the voltage on said output terminal is approximately equal to the voltage applied to said input terminal and, when said second transistor is conductive, the voltage on said output terminal is approximately at ground level, and a discharge transistor connected between said discharge terminal and ground, said discharge transistor being connected to and dominated by said circuit means to be rendered conductive when said second output stage transistor is rendered conductive, and a plurality of circuit components connected to said integrated circuit device, said components including first load circuit components connected between said output terminal and ground to be energized when said first transistor is conductive, second load circuit components connected between said input terminal and said output terminal to be energized when said second transistor is conductive, a capacitor connected between said voltage-level responsive circuit means and ground such that the switching of said circuit means between its alternate states is determined by the voltage on said capacitor, resistance means connected between said input terminal and said capacitor, and resistance means connected between said capacitor and said discharge terminal.

4. The invention of claim 3 in which said first load circuit components include a first light emitting diode and a first resistor and said second load circuit components include a second light emitting diode and a second resistor, said first resistor being effective to prevent conduction of said second diode when said first transistor is conducting, and said second resistor being effective to prevent conduction of said first diode when said second transistor is conducting.

* * * * *